(12) United States Patent
Kahen (10) Patent No.: US 6,836,495 B2
(45) Date of Patent: Dec. 28, 2004

(54) VERTICAL CAVITY LASER INCLUDING INORGANIC SPACER LAYERS

(75) Inventor: Keith B. Kahen, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/431,056

(22) Filed: May 7, 2003

(65) Prior Publication Data

US 2004/0223525 A1 Nov. 11, 2004

(51) Int. Cl.$^7$ .............................................. H01S 3/00
(52) U.S. Cl. ...................................................... 372/39
(58) Field of Search ............................. 372/39–50, 96, 372/99

(56) References Cited

U.S. PATENT DOCUMENTS

| | | | |
|---|---|---|---|
| 5,493,577 A | * 2/1996 | Choquette et al. | ............ 372/46 |
| 5,881,083 A | 3/1999 | Diaz-Garcia et al. | |
| 5,881,089 A | 3/1999 | Berggren et al. | |
| 6,160,828 A | * 12/2000 | Kozlov et al. | ................ 372/39 |
| 6,498,802 B1 | * 12/2002 | Chu et al. | ..................... 372/39 |
| 6,687,274 B2 | * 2/2004 | Kahen | ......................... 372/39 |

OTHER PUBLICATIONS

"Pulsed excitation of low–mobility light–emitting diodes: Implication for organic lasers" by N. Tessler, et al., Applied Physics Letters, vol. 74, No. 19, May 10, 1999, pp. 2764–2766.
"Study of lasing action based on Forster energy transfer in optically pumped organic semiconductor thin films", by V. G. Kozlov et al., Journal of Applied Physics, vol. 84, No. 8, Oct. 15, 1998, pp. 4096–4108.
"Circular Buried Heterostructure (CBH) GaAlAs/GaAs Surface Emitting Lasers", by Susumu Kinoshita et al., IEEE Journal of Quantum Electronics, vol. QE–23, No. 6, Jun. 1987, pp. 882–888.
"Vertical–cavity surface emitting lasers: Moving from research to manufacturing", by Kent D. Choquette et al., Proceedings of the IEEE, vol. 85, No. 11, Nov. 1997, pp. 1730–1739.
"Vertical–cavity surface–emitting lasers, Design, Fabrication, Characterization, and Applications" by Carl W. Wilmsen, Cambridge University Press, no month available.
T. Ishigure et al., Electron. Lett. 31, (1995), p. 467–, no month.
"Organic solid–state lasers" by G. Kranzelbinder et al., Rep. Prog. Phys. 63 (2000) 729–762, no month.
"Light amlification in organic thin films using cascade energy transfer" by M. Berggren et al., Nature, vol. 389, Oct. 12, 1997.
"High peak brightness polymer light–emitting diodes" by Nir Tessler, et al., Advanced Materials 1998, 10, No. 1, pp. 64–68, no month.
"Semiconducting polymer distributed feedback lasers" by M. D. McGehee et al., vol. 72, No. 13, Mar. 30, 1998.
"Design of Fabry–Perot surface–emitting lasers with a periodic gain structure" by Scott W. Corzine et al., IEEE Journal of Quantum Electronics vol. 25, No. 6, Jun. 1989.

* cited by examiner

*Primary Examiner*—Quyen Leung
(74) *Attorney, Agent, or Firm*—Raymond L. Owens (57) ABSTRACT

A vertical cavity laser light producing device includes a substrate; a bottom dielectric stack reflective to light over a predetermined range of wavelengths; and an active region for producing laser light. The device also includes a top dielectric stack spaced from the bottom dielectric stack and reflective to light over a predetermined range of wavelengths; and the active region includes one or more periodic organic gain region(s) and inorganic spacer layers disposed on either side of the periodic organic gain region(s) and arranged so that the periodic organic gain region(s) is aligned with the antinodes of the device's standing wave electromagnetic field.

12 Claims, 4 Drawing Sheets

VERTICAL CAVITY LASER INCLUDING INORGANIC SPACER LAYERS

CROSS REFERENCE TO RELATED APPLICATIONS

Reference is made to commonly assigned U.S. patent application Ser. No. 10/066,936 filed Feb. 4, 2002 by Keith B. Kahen et al., entitled "Organic Vertical Cavity Lasing Devices Containing Periodic Gain Regions"; commonly assigned U.S. patent application Ser. No. 10/066,829 filed Feb. 4, 2002 by Keith B. Kahen, entitled "Organic Vertical Cavity Phase-Locked Laser Array Device"; commonly assigned U.S. patent application Ser. No. 10/269,652 filed Oct. 11, 2002 by Keith B. Kahen et al., entitled "Organic Vertical Cavity Lasing Devices Having Organic Active Region", and commonly assigned U.S. patent application Ser. No. 10/368,164 filed Feb. 18, 2003 by Keith B. Kahen et al., entitled "Organic Laser Having Improved Linearity", the disclosures of which are herein incorporated by reference.

FIELD OF THE INVENTION

The present invention relates to vertical cavity organic lasers, which have reduced spectral broadening as a function of input power.

BACKGROUND OF THE INVENTION

Vertical cavity surface emitting lasers (VCSELs) based on inorganic semiconductors (e.g. AlGaAs) have been developed since the mid-80's (K. Kinoshita et al., IEEE J. Quant. Electron. QE-23, 882 [1987]). They have reached the point where AlGaAs-based VCSELs emitting at 850 nm are manufactured by a number of companies and have lifetimes beyond 100 years (K. D. Choquette et al., Proc. IEEE 85, 1730 [1997]). With the success of these near-infrared lasers, attention in recent years has turned to other inorganic material systems to produce VCSELs emitting in the visible wavelength range (C. Wilmsen et al., Vertical-Cavity Surface-Emitting Lasers, Cambridge University Press, Cambridge, 2001). There are many potential applications for visible lasers, such as, display, optical storage reading/writing, laser printing, and short-haul telecommunications employing plastic optical fibers (T. Ishigure et al., Electron. Lett. 31, 467 [1995]). In spite of the worldwide efforts of many industrial and academic laboratories, much work remains to be done to create viable laser diodes (either edge emitters or VCSELs) that produce light output that spans the visible spectrum.

In an effort to produce visible wavelength VCSELs, it would be advantageous to abandon inorganic-based systems and focus on organic-based laser systems, since organic-based gain materials can enjoy a number of advantages over inorganic-based gain materials in the visible spectrum. For example, typical organic-based gain materials have the properties of low unpumped scattering/absorption losses and high quantum efficiencies. In comparison to inorganic laser systems, organic lasers are relatively inexpensive to manufacture, can be made to emit over the entire visible range, can be scaled to arbitrary size and, most importantly, are able to emit multiple wavelengths (such as red, green, and blue) from a single chip. Over the past number of years, there has been increasing interest in making organic-based solid-state lasers. The laser gain material has been either polymeric or small molecule and a number of different resonant cavity structures were employed, such as, microcavity (Kozlov et al., U.S. Pat. No. 6,160,828), waveguide, ring microlasers, and distributed feedback (see also, for instance, G. Kranzelbinder et al., Rep. Prog. Phys. 63, 729 and M. Diaz-Garcia et al., U.S. Pat. No. 5,881,083). A problem with all of these structures is that, in order to achieve lasing, it was necessary to excite the cavities by optical pumping using another laser source. It is much preferred to electrically pump the laser cavities since this generally results in more compact and easier to modulate structures.

A main barrier to achieving electrically-pumped organic lasers is the small carrier mobility of organic material, which is typically on the order of $10^{-5}$ cm$^2$/(V-s). This low carrier mobility results in a number of problems. Devices with low carrier mobilities are typically restricted to using thin layers in order to avoid large voltage drops and ohmic heating. These thin layers result in the lasing mode penetrating into the lossy cathode and anode, which causes a large increase in the lasing threshold (V. G. Kozlov et al., J. Appl. Phys. 84, 4096 [1998]). Since electron-hole recombination in organic materials is governed by Langevin recombination (whose rate scales as the carrier mobility), low carrier mobilities result in orders of magnitude more charge carriers than singlet excitons; one of the consequences of this is that charge-induced (polaron) absorption can become a significant loss mechanism (N. Tessler et al., Appl. Phys. Lett. 74, 2764, [1999]). Assuming laser devices have a 5% internal quantum efficiency, using the lowest reported lasing threshold to date of ~100 W/cm$^2$ (M. Berggren et al., Nature 389, 466, [1997]), and ignoring the above mentioned loss mechanisms, would put a lower limit on the electrically-pumped lasing threshold of 1000 A/cm$^2$. Including these loss mechanisms would place the lasing threshold well above 1000 A/cm$^2$, which to date is the highest reported current density, which can be supported by organic devices (N. Tessler, Adv. Mater. 19, 64 [1998]).

An alternative to electrical pumping for organic lasers is optical pumping by incoherent light sources, such as light emitting diodes (LEDs), either inorganic (M. D. McGehee et al. Appl. Phys. Lett. 72, 1536 [1998]) or organic (Berggren et al., U.S. Pat. No. 5,881,089). This possibility is the result of unpumped organic laser systems having greatly reduced combined scattering and absorption losses (~0.5 cm$^{-1}$) at the lasing wavelength, especially when one employs a host-dopant combination as the active media. Even taking advantage of these small losses, the smallest reported optically-pumped threshold for organic lasers to date is 100 W/cm$^2$ based on a waveguide laser design (M. Berggren et al., Nature 389, 466 [1997]). Since off-the-shelf inorganic LEDs can only provide up to ~20 W/cm$^2$ of power density, a different route must be taken to provide for optically pumping by incoherent sources. In order to lower the lasing threshold additionally, it is necessary to choose a laser structure, which minimizes the gain volume; a VCSEL-based microcavity laser satisfies this criterion. Using VCSEL-based organic laser cavities should enable optically-pumped power density thresholds below 5 W/cm$^2$. As a result practical organic laser devices can be driven by optically pumping them with a variety of readily available, incoherent light sources, such as LEDs.

Figure 1:
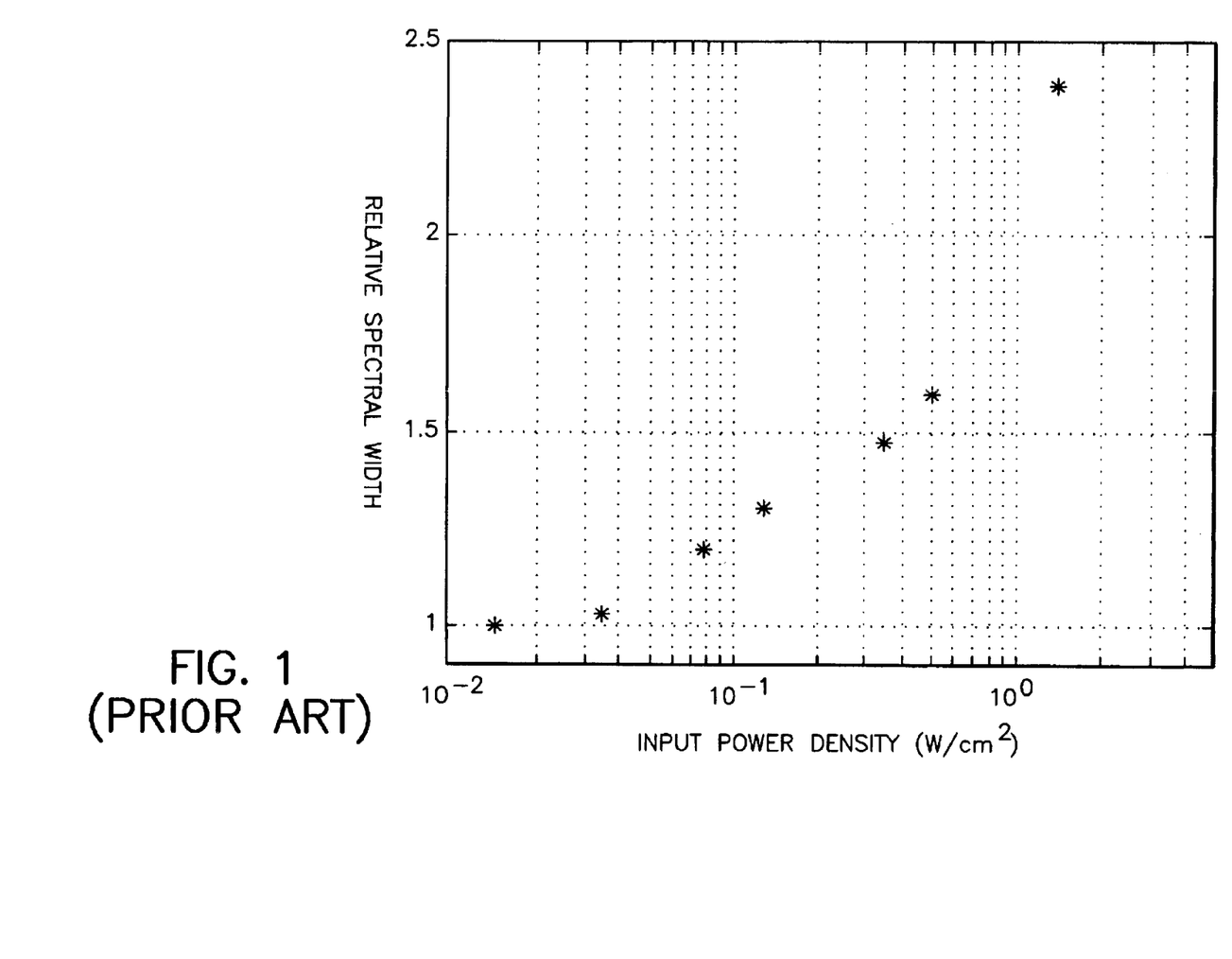
FIG. 1 is a graph which shows the relative spectral linewidth of the laser emission as a function of the input pump-beam power for a prior art organic vertical cavity laser device.

It would be highly desirable to have an organic VCSEL laser device where the laser emission's spectral linewidth remains relatively invariant with pump-beam power density. Unfortunately for actual organic-based VCSEL devices, as shown in FIG. 1, the spectral width of the laser emission increases dramatically with pump-beam power density. The VCSEL laser cavity used to produce the data was composed of a 23 layer bottom dielectric stack of TiO$_2$ and SiO$_2$ (peak reflectivity of 99.3% at 560 nm), a 0.496 μm thick periodic gain (Corzine et al. IEEE J. Quant. Electr. 25, 1513 [1989]) active region, and a 29 layer top dielectric stack of TiO$_2$ and SiO$_2$ (peak reflectivity of 99.98% at 560 nm). The periodic gain active region contained two 0.025 μm thick layers of aluminum tris(8-hydroxyquinoline) [Alq] doped with 0.5% of [10-(2-benzothiazolyl)-2,3,6,7-tetrahydro-1,1,7,7-tetramethyl-1H,5H,11 H-[1]Benzopyrano[6,7,8-ij] quinolizin-11-one] (C545T), separated by layers of 1,1-Bis-(4-bis(4-methyl-phenyl)-amino-phenyl)-cyclohexane (TAPC). The pumps beam was the focused output (1000 mm lens) from a 403 nm 5 mW Nichia laser diode with a repetition rate of 5 KHz and a pulse width of 50 nsec, where its power density was varied by usage of two optical density wheels. The data in FIG. 1 was obtained by reimaging the laser output (using a 50 mm collecting lens and a 100 mm focusing lens) onto the entrance slit of JY Horiba TE-cooled double monochromator (0.55 m length).

SUMMARY OF THE INVENTION

It is therefore an object of the present invention to provide an organic vertical cavity laser device that decreases the spectral linewidth broadening problem.

It has been found that by including inorganic spacer layers in the active region that the above mentioned difficulty can be significantly reduced.

This object is achieved by a vertical cavity laser light producing device, comprising:

a) a substrate;

b) a bottom dielectric stack reflective to light over a predetermined range of wavelengths;

c) an active region for producing laser light;

d) a top dielectric stack spaced from the bottom dielectric stack and reflective to light over a predetermined range of wavelengths; and e) the active region includes one or more periodic organic gain region(s) and inorganic spacer layers disposed on either side of the periodic organic gain region(s) and arranged so that the periodic organic gain region(s) is aligned with the antinodes of the device's standing wave electromagnetic field.

Advantages

A feature of the present invention is that by the use of inorganic spacer layers in organic vertical cavity lasers, significant improvements can be made in reducing the laser emission's spectral linewidth broadening.

DETAILED DESCRIPTION OF THE INVENTION

Figure 2:
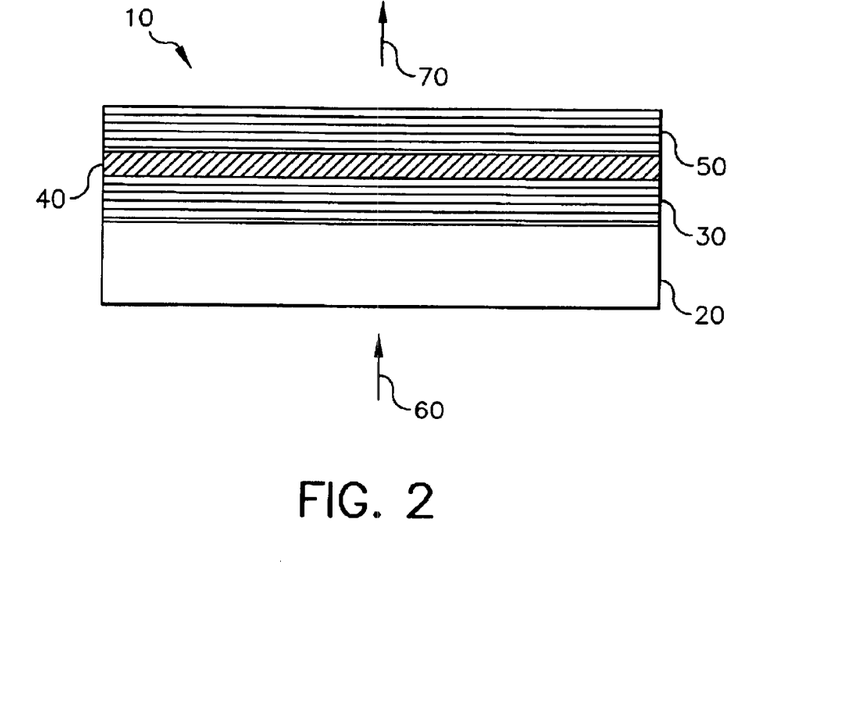
FIG. 2 shows a side view schematic of an optically pumped organic-based vertical cavity laser according to the present invention.

A schematic of a vertical cavity organic laser device 10 is shown in FIG. 2. The substrate 20 can either be light transmissive or opaque, depending on the intended direction of optical pumping and laser emission. Light transmissive substrates 20 may be transparent glass or plastic. Alternatively, opaque substrates including, but not limited to, semiconductor material (e.g. silicon) or ceramic material may be used in the case where both optical pumping and emission occur through the same surface. On the substrate is deposited a bottom dielectric stack 30. An active region 40 is then deposited, followed by a top dielectric stack 50. A pump beam 60 optically drives the vertical cavity organic laser device 10 through the substrate 20 and the bottom dielectric stack 30 and is mainly absorbed by the organic active region 40. The source of the pump-beam may be incoherent, such as, emission from a light-emitting diode (LED). Alternatively, the pump-beam may originate from a coherent laser source. FIG. 2 shows laser emission 70 from the top dielectric stack 50. Alternatively, the laser structure could be optically pumped through the top dielectric stack 50 with the laser emission through the substrate 20 by proper design of the dielectric stack reflectivities. In the case of an opaque substrate, such as silicon, both optical pumping and laser emission occur through the top dielectric stack 50.

The bottom and top dielectric stacks 30 and 50 are preferably deposited by conventional electron-beam deposition and are composed of alternating high index and low index dielectric materials, such as, $TiO_2$ and $SiO_2$, respectively. Other materials, such as $Ta_2O_5$ for the high index layers, could be used. The bottom dielectric stack 30 is deposited at a temperature of approximately 240° C. During the top dielectric stack 50 deposition process, the temperature is maintained at around 70° C. to avoid melting the organic active materials. In an alternative embodiment of the present invention, the top dielectric stack is replaced by the deposition of a reflective metal mirror layer. Typical metals are silver or aluminum, which have reflectivities in excess of 90% in the visible wavelength range. In this alternative embodiment, both the pump-beam 60 and the laser emission 70 would proceed through the substrate 20. Both the bottom dielectric stack 30 and the top dielectric stack 50 are reflective to laser light over a predetermined range of wavelengths. It has been found by experimentation that in order to obtain lasing peaks with full widths at half-maximum (FWHM) less than 1 nm, it is desirable to have the reflectances of both the top and bottom dielectric stacks be greater than ~99% at the laser emission wavelength.

Figure 3:
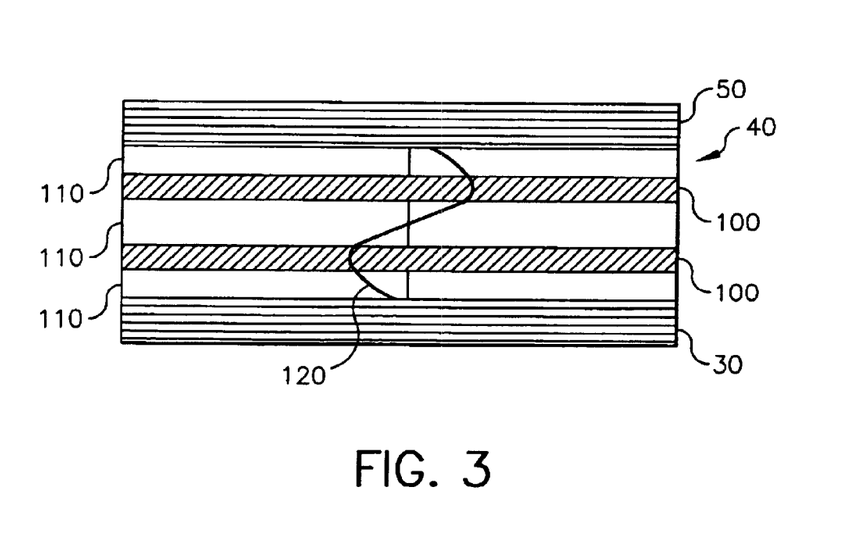
FIG. 3 is a side view schematic of an optically pumped organic-based vertical cavity laser showing gain region placement within the active region according to the present invention.

FIG. 3 is a side view schematic of the vertical cavity organic laser device 10 with a more detailed view of the active region 40. The active region 40 includes one or more periodic gain regions 100 and inorganic spacer layers 110 disposed on either side of the periodic gain regions and arranged so that the periodic gain regions are aligned with the antinodes of the device's standing wave electromagnetic field. This is illustrated in FIG. 3 where the laser's standing electromagnetic field pattern 120 in the active region 40 is schematically drawn. The placement of the gain region(s) is determined by using the standard matrix method of optics (Corzine et al. IEEE J. Quant. Electr. 25, 1513 [1989]). Since stimulated emission is highest at the antinodes and negligible at the nodes of the electromagnetic field, it is inherently advantageous to form the active region 40 as shown in FIG. 3. The inorganic spacer layers 110 do not undergo stimulated or spontaneous emission and largely do not absorb either the laser emission 70 or the pump-beam 60 wavelengths. An example of an inorganic spacer layer 110 is the dielectric material $SiO_2$. $SiO_2$ works well as the spacer material since it does not absorb either the laser output or the pump-beam and, in addition, its refractive index is lower than that of most organic host materials. This refractive index difference is useful since it helps in maximizing the overlap between the electromagnetic field antinodes and the periodic gain region(s) 100.

The main advantage of employing inorganic spacer materials, such as, SiO$_2$, over organic spacer materials, such as, TAPC, in laser devices is that SiO$_2$ has a greatly reduced thermo-optic coefficient (dn/dT, where n is the index of refraction and T is the temperature). More specifically, the measured thermo-optic coefficients for TAPC is $-104 \times 10^{-6}$ K$^{-1}$, while that for SiO$_2$ is an order of magnitude smaller at $-10 \times 10^{-6}$ K$^{-1}$. Large thermo-optic coefficients result in greater changes in the effective length of the laser cavity as a function of pump-beam power (due to the device's temperature rising for greater pump-beam power densities). Since changes in the length of the laser cavity result in variations in the lasing wavelength, the result is that laser cavities which incorporate materials with high thermo-optic coefficients are more susceptible to spectral broadening effects for increasing pump-beam power densities. It is desirable to use dielectric materials, such as, SiO$_2$ as the inorganic spacer layers since they generally have smaller thermo-optic coefficients and are typically transparent to visible wavelengths. As an example, TiO$_2$ is also transparent in the visible and has a thermo-optic coefficient of $-2 \times 10^{-6}$ K$^{-1}$.

Unless otherwise specifically stated, use of the term "substituted" or "substituent" means any group or atom other than hydrogen. Additionally, when the term "group" is used, it means that when a substituent group contains a substitutable hydrogen, it is also intended to encompass not only the substituent's unsubstituted form, but also its form further substituted with any substituent group or groups as herein mentioned, so long as the substituent does not destroy properties necessary for device utility. Suitably, a substituent group may be halogen or may be bonded to the remainder of the molecule by an atom of carbon, silicon, oxygen, nitrogen, phosphorous, sulfur, selenium, or boron. The substituent may be, for example, halogen, such as chloro, bromo or fluoro; nitro; hydroxyl; cyano; carboxyl; or groups which may be further substituted, such as alkyl, including straight or branched chain or cyclic alkyl, such as methyl, trifluoromethyl, ethyl, t-butyl, 3-(2,4-di-t-pentylphenoxy) propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy)ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentylphenoxy)acetamido, alpha-(2,4-di-t-pentylphenoxy) butyramido, alpha-(3-pentadecylphenoxy)-hexanamido, alpha-(4-hydroxy-3-t-butylphenoxy)-tetradecanamido, 2-oxo-pyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-1-butylphenoxycarbonylamino, phenylcarbonylamino, 2,5-(di-t-pentylphenyl)carbonyl amino, p-dodecyl-phenylcarbonylamino, p-tolylcarbonylamino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl)ureido, N,N-(2, 5-di-t-pentylphenyl)-N'-ethylureido, and t-butylcarbonamido; sulfonamido, such as methylsulfonamido, benzenesulfonamido, p-tolylsulfonamido, p-dodecylbenzenesulfonamido, N-methyltetradecylsulfonamido, N,N-dipropyl-sulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl]-sulfamoyl, N-[4-(2,4-di-t-pentylphenoxy)butyl] sulfamoyl, N-methyl-N-tetradecylsulfamoyl, and N-dodecylsulfamoyl; carbamoyl, such as N-mothylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy)acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxy-sulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hcxadecylsulfonyloxy; sulfinyl, such as mcthylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, p-ethylcarbamoyloxy, and cyclohexylcarbonyloxy; amine, such as phenylanilino, 2-chloroanilino, diethylamine, dodecylamine; imino, such as 1 (N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which may be substituted and which contain a 3 to 7 membered heterocyclic ring composed of carbon atoms and at least one hetero atom selected from the group consisting of oxygen, nitrogen, sulfur, phosphorous, or boron, such as 2-furyl, 2-thienyl, 2-benzimidazolyloxy or 2-benzothiazolyl; quaternary ammonium, such as triethylammonium; quaternary phosphonium, such as triphenylphosphonium; and silyloxy, such as trimethylsilyloxy.

If desired, the substituents may themselves be further substituted one or more times with the described substituent groups. The particular substituents used may be selected by those skilled in the art to attain the desired properties for a specific application and can include, for example, electron-withdrawing groups, electron-donating groups, and steric groups. When a molecule may have two or more substituents, the substituents may be joined together to form a ring such as a fused ring unless otherwise provided. Generally, the above groups and substituents thereof may include those having up to 48 carbon atoms, typically 1 to 36 carbon atoms and usually less than 24 carbon atoms, but greater numbers are possible depending on the particular substituents selected. Substitution can include fused ring derivatives such as, but not limited to benzo-, dibenzo-, naphtha-, or dinaphtho-fused derivatives. These fused ring derivatives can be further substituted as well.

The emissive material, or periodic gain region(s) 100, can be comprised of a single host material, but more commonly consists of a host material doped with a guest compound (dopant) or compounds where light emission comes primarily from the dopant and can be of any color. These host-dopant combinations are advantageous since they result in very small unpumped scattering/absorption losses for the gain media (can be less than 1 cm$^{-1}$). The dopant is usually chosen from highly fluorescent dyes, but phosphorescent compounds, e.g., transition metal complexes as described for OLED applications in WO 98/55561, WO 00/18851,

WO 00/57676, and WO 00/70655 are also useful. Dopants are typically coated as 0.01 to 10% by weight into the host material, wherein they can be selected to provide emitted light having hues of either red, green, or blue. An example of a useful host-dopant combination for red emitting layers is Alq as the host material and 1% L39 [4-(dicyanomethylene)-2-t-butyl-6-(1,1,7,7-tetramethyljulolidyl-9-enyl)-4H-pyran] as the dopant.

An important relationship for choosing a dye as a dopant is a comparison of the absorption of the dopant material and emission of the host material. For efficient energy transfer (via Forster energy transfer) from the host to the dopant molecule, a necessary condition is that the absorption of the dopant overlaps the emission of the host material. Those skilled in the art are familiar with the concept of Forster energy transfer, which involves a radiationless transfer of energy between the host and dopant molecules. An important relationship for choosing the host material is that the absorption of the host material significantly overlaps the emission spectrum of the pump-beam 60 light. In addition, it is preferred that the absorption of the host material or a host material plus a dopant is small at the laser emission wavelength of the device 10. An acceptable level of absorption is that the absorption coefficient of the host plus dopant combination is less than 10 cm$^{-1}$ at the wavelength of the laser emission.

Useful fluorescent emissive materials includes polycyclic aromatic compounds as described in I. B. Berlman, "Handbook of Fluorescence Spectra of Aromatic Molecules," Academic Press, New York, 1971 and EP 1 009 041. Tertiary aromatic amines with more than two amine groups may be used including oligomeric materials.

Another class of useful emissive materials (for host or dopants) include aromatic tertiary amines, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or an oligomeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al. U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula A.

A wherein:

Q$_1$ and Q$_2$ are independently selected aromatic tertiary amine moieties; and G is a linking group such as an arylene, cycloalkylene, or alkylene group of a carbon to carbon bond.

In one embodiment, at least one of Q$_1$ or Q$_2$ contains a polycyclic fused ring structure, e.g., a naphthalene. When G is an aryl group, it is conveniently a phenylene, biphenylene, or naphthalene moiety.

A useful class of triarylamines satisfying structural Formula A and containing two triarylamine moieties is represented by structural Formula B.

B where:

R$_1$ and R$_2$ each independently represent a hydrogen atom, an aryl group, or an alkyl group or R$_1$ and R$_2$ together represent the atoms completing a cycloalkyl group; and

R$_3$ and R$_4$ each independently represent an aryl group, which is in turn substituted with a diaryl substituted amino group, as indicated by structural Formula C.

C wherein R$_5$ and R$_6$ are independently selected aryl groups. In one embodiment, at least one of R$_5$ or R$_6$ contains a polycyclic fused ring structure, e.g., a naphthalene.

The host material can comprise a substituted or unsubstituted triarylamine compound. Another class of aromatic tertiary amines are the tetraaryldiamines. Desirable tetraaryldiamines include two diarylamino groups, such as indicated by Formula C, linked through an arylene group. Useful tetraaryldiamines include those represented by Formula D.

D wherein:

each Are is an independently selected arylene group, such as a phenylene or anthracene moiety;

n is an integer of from 1 to 4; and

Ar, R$_7$, R$_8$, and R$_9$ are independently selected aryl groups.

In a typical embodiment, at least one of Ar, R$_7$, R$_8$, and R$_9$ is a polycyclic fused ring structure, e.g., a naphthalene.

The various alkyl, alkylene, aryl, and arylene moieties of the foregoing structural Formulae A, B, C, D, can each in turn be substituted. Typical substituents include alkyl groups, alkoxy groups, aryl groups, aryloxy groups, and halogens such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms—e.g., cyclopentyl, cyclohexyl, and cycloheptyl ring structures. The aryl and arylene moieties are usually phenyl and phenylene moieties.

The emissive material can be formed of a single or a mixture of aromatic tertiary amine compounds. Specifically, one may employ a triarylamine, such as a triarylamine satisfying the Formula B, in combination with a tetraaryldiamine, such as indicated by Formula D. The host material can include a substituted or unsubstituted dicarbazole-biphenyl compound. Illustrative of useful aromatic tertiary amines is the following:

4,4'-N,N'-dicarbazole-1,1'-biphenyl (CBP) (D1)

4,4'-Bis[N-(1-naphthyl)-N-phenylamino]biphenyl (D2)

4,4'-Bis[N-(1-naphthyl)-N-(2-naphthyl)amino]biphenyl (D3)

4,4'-Bis[N-(2-naphthyl)-N-p-tolylamino]biphenyl (D4)

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4,4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenyl amino] biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis {N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene
4,4',4"-tris[(3-methylphenyl)phenylamino]triphenylamine.

The host material can comprise a substituted or unsubstituted aza-aromatic compound. For example, the host material can comprise a substituted or unsubstituted acridine, quinoline, purine, phenazine, phenoxazine, or phenanthroline compound. Carbazole derivatives are useful hosts. Useful examples of phenanthroline materials include 2,9-dimethyl-4,7-diphenyl-1,10-phenanthroline and 4,7-diphenyl-1,10-phenanthroline.

Host and dopant molecules include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula E) constitute one class of useful host materials capable of supporting electroluminescence, and are particularly suitable for light emission of wavelengths longer than 500 nm, e.g., green, yellow, orange, and red.

E wherein:
M represents a metal;
n is an integer of from 1 to 3; and
Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such aluminum or gallium, or a transition metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

The host material can comprise a substituted or unsubstituted chelated oxinoid compound.

Illustrative of useful chelated oxinoid compounds are the following:

CO-1: Aluminum trisoxine [alias, tris(8-quinolinolato)aluminum(III)]

CO-2: Magnesium bisoxine [alias, bis(8-quinolinolato)magnesium(II)]

CO-3: Bis[benzo {f}-8-quinolinolato]zinc (II)

CO-4: Bis(2-methyl-8-quinolinolato)aluminum(III)-$\mu$-oxo-bis(2-methyl-8-quinolinolato) aluminum(III)

CO-5: Indium trisoxine [alias, tris(g-quinolinolato)indium]

CO-6: Aluminum tris(5-methyloxine) [alias, tris(5-methyl-8-quinolinolato) aluminum(III)]

CO-7: Lithium oxine [alias, (8-quinolinolato)lithium(I)]

CO-8: Gallium oxine [alias, tris(8-quinolinolato)gallium (III)]

CO-9: Zirconium oxine [alias, tetra(8-quinolinolato)zirconium(IV)]

The host material can include a substituted or unsubstituted anthracene compound.

Derivatives of 9,10-di-(2-naphthyl)anthracene (Formula F) constitute one class of useful hosts capable of supporting photoluminescence, and are particularly suitable for light emission of wavelengths longer than 400 nm, e.g., blue, green, yellow, orange or red.

F wherein $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;
Group 2: aryl or substituted aryl of from 5 to 20 carbon atoms;

Group 3: carbon atoms from 4 to 24 necessary to complete a fused aromatic ring of anthracenyl, pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxyamino, alkylamino, or arylamino of from 1 to 24 carbon atoms; and Group 6: fluorine, chlorine, bromine or cyano.

Illustrative examples include 9,10-di-(2-naphthyl) anthracene (F1) and 2-t-butyl-9,10-di-(2-naphthyl) anthracene (F2). Other anthracene derivatives can be useful as a host, including derivatives of 9,10-bis-(4-(2,2'-diphenylethenyl)phenyl)anthracene.

Benzazole derivatives (Formula G) constitute another class of useful hosts capable of supporting photoluminescence, and are particularly suitable for light emission of wavelengths longer than 400 nm, e.g., blue, green, yellow, orange or red.

(G)

where:

n is an integer of 3 to 8;

Z is O, NR or S; and

R and $R^1$ are individually hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and L is a linkage unit consisting of alkyl, aryl, substituted alkyl, or substituted aryl, which conjugately or unconjugately connects the multiple benzazoles together. An example of a useful benzazole is 2, 2', 2"-(1,3,5-phenylene)tris[1-phenyl-1H-benzimidazole].

The host material can comprise a substituted or unsubstituted benzoxazole compound, a substituted or unsubstituted benzthiazole compound, or a substituted or unsubstituted benzimidazole compound. The host material can comprise a substituted or unsubstituted oxazole compound, a substituted or unsubstituted triazole compound, or a substituted or unsubstituted oxadiazole compound. Useful examples of oxazole compounds include 1,4-bis(5-phenyloxazol-2-yl)benzene, 1,4-bis(4-methyl-5-phenyloxazol-2-yl)benzene, and 1,4-bis(5-(p-biphenyl) oxazol-2-yl)benzene. Useful examples of oxadiazole compounds include 2-(4-biphenylyl)-5-phenyl-1,3,4-oxadiazole and 2-(4-biphenylyl)-5-(4-tert-butylphenyl)-1,3,4-oxadiazole. Useful examples of triazole compounds include 3-(4-biphenylyl)-4-phenyl-5-tert-butylphenyl-1,2,4-triazole.

Distyrylarylene derivatives are also useful as host materials or dopant materials, many examples are described in U.S. Pat. No. 5,121,029. Useful emissive materials (hosts and dopants) can have the general Formulae (H) or (I):

X—CH=CH—Y—CH=CH—Z      (H)

X—(CH=CH)$_n$—Z      (I)

where:

X and Z are independently a substituted or unsubstituted aromatic group or a substituted or unsubstituted aromatic complex ring group having one nitrogen atom;

n equals 1, 2, or 3; and

Y is a divalent aromatic group or a divalent aromatic complex ring group having one nitrogen atom. Useful examples include 1,4-bis(2-methylstyryl)-benzene, 4,4'-(9,10-anthracenediyldi-2,1-ethenediyl)bis(N,N-bis(4-methylphenyl)-benzenamine, 4,4'-(1,4-naphthalenediyldi-2,1-ethenediyl)bis(N,N-bis(4-methylphenyl)benzenamine, and 4,4'-(1,4-phenylenedi-2,1-ethenediyl)bis(N,N-(4-tolyl)) benzeneamine.

The dopant is selected to provide emission between 300–1700 mm. The dopant can be selected from fluorescent or phosphorescent dyes. Useful fluorescent dopants include materials as described as host materials above. Other useful fluorescent dopants include, but are not limited to, derivatives of substituted or unsubstituted anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis(azinyl)methane compounds, napthyridine, fluoranthene, furan, indole, thiaphene, benzoxanthene, pyrene, peropyrene, terphenyl, quaterphenyl, quinquephenyl, sexiphenyl, anthanthrene, bisanthrene compounds, N,N,N',N'-tetrasubstituted benzidene derivatives, N,N,N',N'-tetrarylbenzidene derivatives and carbostyryl compounds or combinations thereof. Derivatives of these classes of materials can also serve as useful host materials or combinations thereof. Host materials will often be compounds containing at least three phenylene moieties.

Illustrative examples of useful dopants include, but are not limited to, the following:

L1

L2

L3

L4

L5

L6

L7

L8

| | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |

| | X | R1 | R2 |
|---|---|---|---|
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |

| | R |
|---|---|
| L37 | phenyl |
| L38 | methyl |
| L39 | t-butyl |
| L40 | mesityl |

| | R |
|---|---|
| L41 | phenyl |
| L42 | methyl |
| L43 | t-butyl |
| L44 | mesityl |

-continued

L50

L51

L52

L53

L54

L55

L56

-continued

L57

L58

L59

L60

L61

-continued

L62

Other emissive materials include various heterocyclic optical brighteners as described in U.S. Pat. No. 4,539,507.

The emissive material can also be a polymeric material, a blend of two or more polymeric materials, or a doped polymer or polymer blend. The emissive material can also be a combination of more than one nonpolymeric and polymeric materials with or without dopants. Typical dopants are listed previously for nonpolymeric molecules. Nonpolymeric dopants can be molecularly dispersed into the polymeric host, or the dopant could be added by copolymerizing a minor constituent into the host polymer. Typical polymeric materials include, but are not limited to, substituted and unsubstituted poly(p-phenylenevinylene) (PPV) derivatives, substituted and unsubstituted poly(p-phenylene) (PPP) derivatives, substituted and unsubstituted polyfluorene (PF) derivatives, substituted and unsubstituted poly(p-pyridine), substituted and unsubstituted poly(p-pyridalvinylene) derivatives, and substituted, unsubstituted poly(p-phenylene) ladder and step-ladder polymers, and copolymers thereof as taught by Diaz-Garcia et al. in U.S. Pat. No. 5,881,083 and references therein. The substituents include but are not limited to alkyls, cycloalkyls, alkenyls, aryls, heteroaryls, alkoxy, aryloxys, amino, nitro, thio, halo, hydroxy, and cyano. Typical polymers are poly(p-phenylene vinylene), dialkyl-, diaryl-, diamino-, or dialkoxy-substituted PPV, mono alkyl-mono alkoxy-substituted PPV, mono aryl-substituted PPV, 9,9'-dialkyl or diaryl-substituted PF, 9,9'-mono alky-mono aryl substituted PF, 9-mono alky or aryl substituted PF, PPP, dialkyl-, diamino-, diaryl-, or dialkoxy-substituted PPP, mono alkyl-, aryl-, alkoxy-, or amino-substituted PPP. In addition, polymeric materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

The organic materials mentioned above are suitably deposited through sublimation, but can be deposited from a solvent with an optional binder to improve film formation. If the material is a polymer, solvent deposition is usually preferred. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,688,551; 5,851,709; and 6,066,357) and inkjet method (U.S. Pat. No. 6,066,357).

Most organic laser devices are sensitive to moisture or oxygen, or both, so they are commonly sealed in an inert atmosphere such as nitrogen or argon. Desiccant such as alumina, bauxite, calcium sulfate, clays, silica gel, zeolites, alkaline metal oxides, alkaline earth metal oxides, sulfates, or metal halides and perchlorates can be incorporated into the sealed device. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

Figure 4:
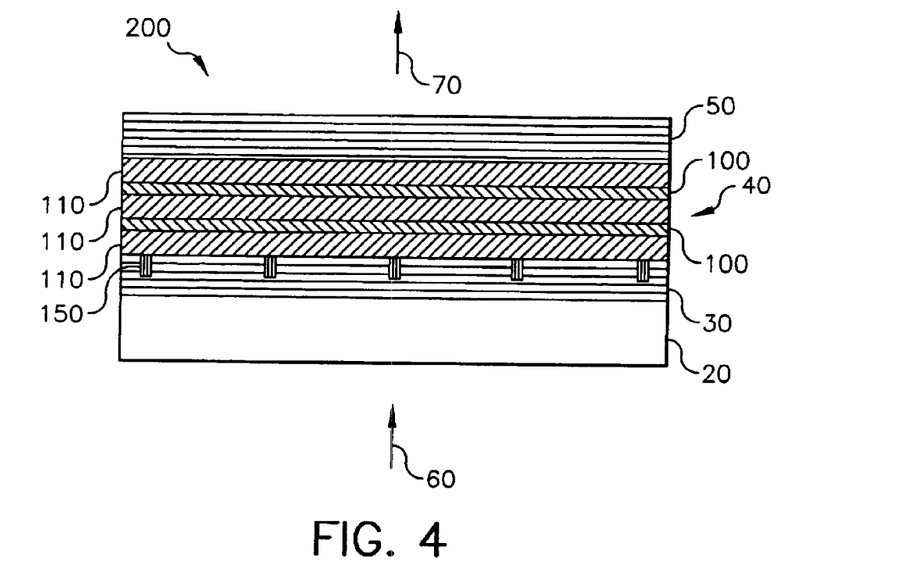
FIG. 4 shows a side view schematic of an optically pumped two-dimensional organic vertical cavity laser array made in accordance with the present invention.

An additional embodiment of the present invention is given in FIG. 4 that shows a two-dimensional laser array device 200. This device enables either single mode or multimode lasing action for large area laser structures. On the substrate 20 is deposited a bottom dielectric stack 30. An active region 40 is then deposited, followed by a top dielectric stack 50. Analogous to the design for laser device 10, the active region 40 includes one or more periodic organic gain regions 100 and inorganic spacer layers 110 disposed on either side of the periodic organic gain regions and arranged so that the periodic organic gain regions are aligned with the antinodes of the device's standing wave electromagnetic field. The compositions and spectral reflectances of the bottom 30 and top 50 dielectric stacks are also analogous to those employed in laser device 10.

Figure 5:
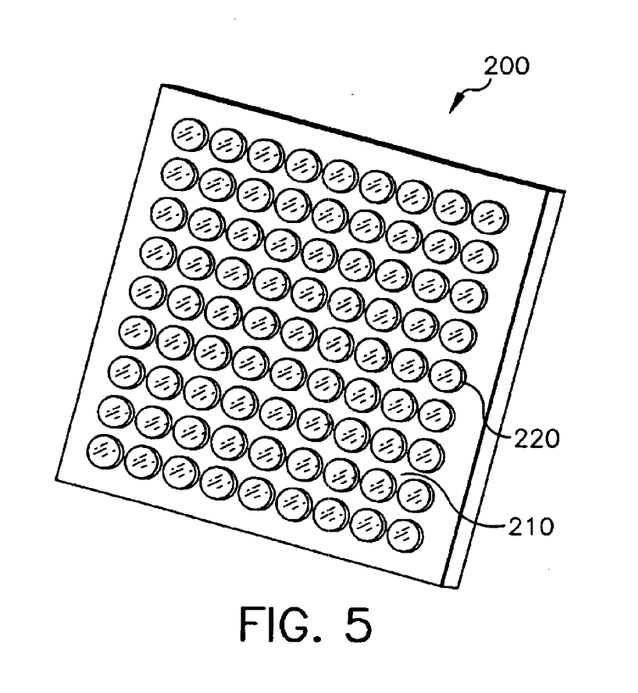
FIG. 5 shows a top-view schematic of an optically pumped two-dimensional organic vertical cavity laser array made in accordance with the present invention.

As shown in FIG. 5, in order to form a two-dimensional laser array 200, which emits either single mode or multimode, on the surface of the VCSEL needs to be defined lasing pixels 220 separated by interpixel regions 210. For inorganic systems where two-dimensional laser arrays were created having either single mode or multimode lasing characteristics, the pixels 220 were formed by modulating the reflectance of the top dielectric stack by either adding metal (E. Kapon and M. Orenstein, U.S. Pat. No. 5,086,430) or by deep etching into the top dielectric stack (P. L. Gourley et al., Appl. Phys. Lett. 58, 890 [1991]). In both inorganic laser array cases, the laser pixels were on the order of 3–5 $\mu$m wide and the interpixel spacing was 1–2 $\mu$m. Applying these results to organic laser systems requires some care, since it is very difficult to perform micron-scale patterning on the laser structure once the organic layers have been deposited. As a result, in the preferred embodiment the reflectance modulation was affected by patterning and forming an etched region 150 in the bottom dielectric stack 30, using standard photolithographic and etching techniques, thus forming a two-dimensional array of circular pillars on the surface of the bottom dielectric stack 30. In the preferred embodiment the shape of the laser pixels is circular, however, other pixel shapes are possible, such as, rectangular. The interpixel spacing is in the range of 0.25 to 4 $\mu$m. Following the inorganic lead and etching deeply into the bottom dielectric stack 30 in order to significantly lower the interpixel reflectivity is not a preferred route since it would lead to significant modulation of the active region position. A preferred method is to make a shallow etch from 50 to 450 nm deep to form etched region 150. The end result of the formation of etched region 150 is that the laser emission is moderately confined to the laser pixels 220, a minimal amount of lasing originates from the interpixel regions 210, and either single mode or multimode laser light is emitted by the array 200.

The laser pixels 220 in FIG. 5 are arranged in a square two-dimensional array. Other arrangements of the laser pixels 220 are allowed, such as, linear arrays or other two-dimensional periodic or random arrangements of the pixels.

Similar to the first embodiment, inorganic spacer layers 110 are employed in the active region 40 in order to lessen the degree of spectral broadening of the laser emission as a result of increased pump-beam power density. As in the first embodiment, the advantage of using inorganic dielectric materials for the spacer layers is that they have small thermo-optic coefficients and are typically transparent to visible wavelengths.

The two-dimensional laser array device 200 is optically driven by an incident pump-beam source 60 and emits either single mode or multimode laser emission 70. Depending on the lasing power density threshold of the organic laser cavity, the pump-beam can be either focused laser light or incoherent LED light. FIG. 4 shows laser emission 70 through the top dielectric stack 50. Alternatively, the laser structure could be optically pumped through the top dielectric stack 50 with the laser emission through the substrate 20 by proper design of the dielectric stack reflectance properties. In the case of an opaque (e.g., silicon) substrate, both optical pumping and laser emission occurs through the top dielectric stack 50. The operation of the optically-pumped organic laser array device occurs by the following means. The pump-beam 60 transmits through the substrate 20 and the bottom dielectric stack 30, and is absorbed by the periodic organic gain region(s) 100, wherein some fraction of the pump-beam energy is re-emitted as longer wavelength laser light. When the pump-beam 60 enters through the substrate 20, to ensure that the laser output 70 mainly exits through the top dielectric stack 50, it is necessary to choose the bottom dielectric stack 30 peak reflectance to be greater than the top dielectric stack 50 peak reflectance. To improve the power conversion efficiency of the device, it is common practice to add additional dielectric layers to both dielectric stacks, such that, the bottom dielectric stack 30 is highly transmissive to the pump-beam 60 and the top dielectric stack 50 is highly reflective to the pump-beam 60. The laser light 70 is emitted by the laser pixels 220.

In an alternative embodiment of the present invention, the top dielectric stack 50 is replaced by the deposition of a reflective metal mirror layer. Typical metals are silver or aluminum, which have reflectivities in excess of 90%. It is preferred that the metals be deposited by vacuum thermal evaporation to avoid causing damage to the underlying organic layers. In this alternative embodiment, both the pump-beam 60 and the laser emission 70 would proceed through the substrate 20.

The following example is presented as further understandings of the present invention and is not to be construed as limitations thereon.

EXAMPLE 1

In order to determine the impact on the lasing characteristics of employing inorganic spacer layers 110 in the active region 40, a laser device 10 was fabricated on a pre-cleaned 6-inch quartz substrate 20. Over the substrate 20 was deposited by conventional electron-beam deposition at 240° C. the bottom dielectric stack 30, which was composed of alternating high and low refractive index layers of $TiO_2$ and $SiO_2$, respectively. The resulting dielectric mirror had a measured peak reflectance of ~99.3% at 560 nm. On top of the bottom dielectric stack 30 was deposited the active region 40, which included one periodic organic gain region 100 deposited by high vacuum thermal evaporation, whose thickness was 30 nm. The gain region was surrounded by two 165 nm thick inorganic spacer layers 110, which were composed of $SiO_2$ and deposited by electron-beam deposition. For the bottom $SiO_2$ layer, the electron-beam deposition was performed at 240° C., while for the top $SiO_2$ layer, the deposition was performed at 70° C. Following the active region 40 was deposited a 29 layer top dielectric stack 50 composed of alternating $\lambda/4$ layers of $TiO_2$ and $SiO_2$ (peak reflectivity of 99.98% at 560 nm).

To test the device for its spectral characteristics, the laser cavity was optically pumped from the film side at normal incidence using the 403 nm output from a 5 mW Nichia laser diode. The pump laser produced 50 nsec laser pulses at a repetition rate of 5 KHz. The pump-beam intensity was adjusted by the combination of two neutral density wheels and it was focused onto the laser cavity surface using a 1000 mm lens. The resulting measured pump-beam spot size on the device surface was elliptical with dimensions of 177× 243 $\mu$m. The laser output 70 from the cavity was focused on the entrance slit of a JY-Horiba double monochrometer (0.55 m) by the combination of a 50 mm f2 lens and a 100 mm f4 lens nearest the slit (resulting in a 2× magnification of the laser's near-field image). The resolution of the monochromator is approximately 0.08 nm; its output was detected by a cooled Hamamatsu photomultiplier tube.

Figure 6:
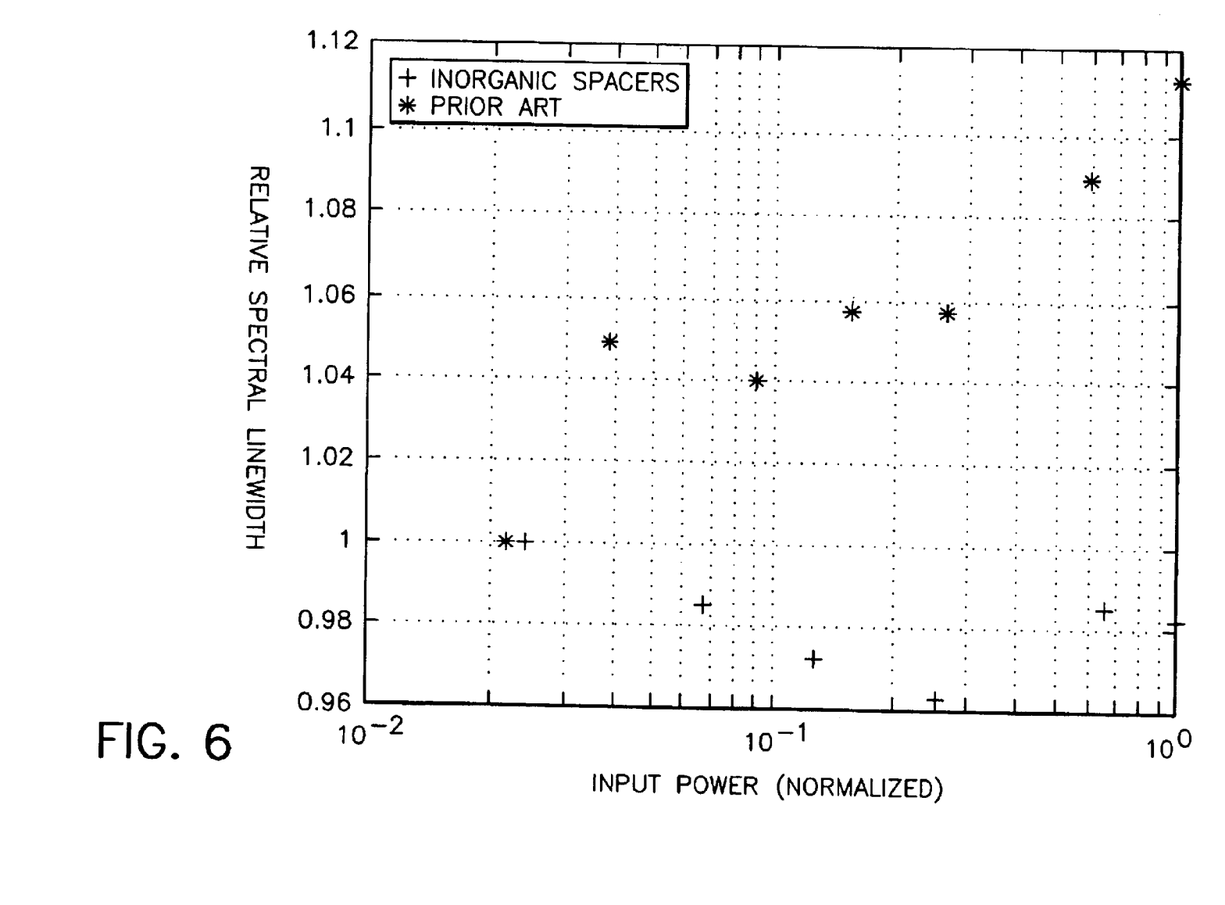
FIG. 6 is a graph which shows the relative spectral linewidth of the laser emission as a function of the input power for a prior art organic vertical cavity laser device and for a device made in accordance with the present invention.

FIG. 6 compares the relative spectral width of the laser emission for a prior art device with organic spacer layers (analogous composition to that of the device measured in FIG. 1) and for a device with inorganic spacer layers 110 in the active region 40. Since the two devices lased at somewhat different thresholds, the pump-beam power density was normalized in FIG. 6 in order to make comparisons at equivalent lasing output powers. FIG. 6 shows that the laser emission's spectral width of the latter device does not broaden at all, in fact, its spectral width somewhat drops with increasing pump-beam power density. On the other hand, the spectral width of the prior art device spectrally broadens immediately at the smallest pump-beam power density. The results from FIG. 6 demonstrate that by employing inorganic spacer layers 110 in the active region 40 results in a marked reduction in the spectral linewidth broadening for increasing pump-beam power densities.

The invention has been described in detail with particular reference to certain preferred embodiments thereof, but it will be understood that variations and modifications can be effected within the spirit and scope of the invention.

Parts List 10 vertical cavity organic laser device
20 light transmissive substrate
30 bottom dielectric stack
40 organic active region
50 top dielectric stack
60 pump-beam
70 laser emission
100 periodic gain region(s)
110 inorganic spacer layers
120 electromagnetic field pattern
150 etched region
200 two-dimensional laser array device
210 interpixel regions
220 lasing pixels

What is claimed is:

1. A vertical cavity laser light producing device, comprising:
   a) a substrate;
   b) a bottom dielectric stack reflective to light over a predetermined range of wavelengths;
   c) an active region for producing laser light;
   d) a top dielectric stack spaced from the bottom dielectric stack and reflective to light over a predetermined range of wavelengths; and
   e) the active region includes one or more periodic organic gain region(s) and inorganic spacer layers disposed on either side of the periodic organic gain region(s) and arranged so that the periodic organic gain region(s) is aligned with the antinodes of the device's standing wave electromagnetic field.

2. The vertical cavity laser light producing device of claim 1 wherein pump-beam light is transmitted and introduced into the active region through at least one of the dielectric stacks.

3. The vertical cavity laser light producing device of claim 1 wherein the active region is a combination of an organic host material and a dopant and the inorganic spacer layers are substantially transparent to the pump-beam and laser light.

4. The vertical cavity laser light producing device of claim 3 wherein the host material is aluminum tris(8-hydroxyquinoline), the dopant is [4-(dicyanomethylene)-2-t-butyl-6-(1,1,7,7-tetramethyljulolidyl-9-enyl)-4H-pyran], and the inorganic spacer layers include silicon dioxide.

5. The vertical cavity laser light producing device of claim 1 wherein the periodic organic gain region includes polymeric materials.

6. A vertical cavity laser light producing device, comprising:
   a) a substrate;
   b) a first dielectric stack reflective to light over a predetermined range of wavelengths;
   c) an active region for producing laser light;
   d) a metallic layer spaced from the first dielectric stack and reflective to light; and
   e) the active region includes one or more periodic organic gain region(s) and inorganic spacer layers disposed on either side of the periodic organic gain region(s) and arranged so that the periodic organic gain region(s) is aligned with the antinodes of the device's standing wave electromagnetic field.

7. A vertical cavity laser array device, comprising:
   a) a substrate;
   b) a bottom dielectric stack reflective to light over a predetermined range of wavelengths and being disposed over the substrate;
   c) an active region for producing laser light;
   d) a top dielectric stack spaced from the bottom dielectric stack and reflective to light over a predetermined range of wavelengths;
   e) the active region includes one or more periodic organic gain region(s) and inorganic spacer layers disposed on either side of the periodic organic gain region(s) and arranged so that the periodic organic gain region(s) is aligned with the antinodes of the device's standing wave electromagnetic field; and
   f) an etched region formed in a surface of the bottom dielectric stack to define an array of spaced laser pixels which have higher reflectance than the interpixel regions so that the array emits either single mode or multimode laser light.

8. The vertical cavity laser array device of claim 7 wherein pump-beam light is transmitted and introduced into the active region through at least one of the dielectric stacks.

9. The vertical cavity laser array device of claim 7 wherein one or more periodic organic gain region(s) is a combination of an organic host material and a dopant and the inorganic spacer layers are substantially transparent to pump-beam light and laser light.

10. The vertical cavity laser array device of claim 7 wherein pixels is in the range of 0.25 to 4 microns.

11. The vertical cavity laser array device of claim 7 wherein the pixels are arranged in a linear array.

12. The vertical cavity laser array device of claim 7 wherein the pixels are arranged in a two-dimensional square array.

* * * * *